(12) United States Patent
Yao et al.

(10) Patent No.: US 12,457,685 B2
(45) Date of Patent: Oct. 28, 2025

(54) CIRCUIT BOARD, LIGHT-EMITTING SUBSTRATE, BACKLIGHT MODULE, AND DISPLAY APPARATUS

(71) Applicant: BOE TECHNOLOGY GROUP CO., LTD., Beijing (CN)

(72) Inventors: Nianqi Yao, Beijing (CN); Kun Zhao, Beijing (CN); Ce Ning, Beijing (CN); Zhengliang Li, Beijing (CN); Zhanfeng Cao, Beijing (CN); Ke Wang, Beijing (CN); Jiaxiang Zhang, Beijing (CN); Qi Qi, Beijing (CN); Hehe Hu, Beijing (CN); Feifei Li, Beijing (CN); Jie Huang, Beijing (CN); Jiayu He, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/552,754

(22) PCT Filed: Oct. 31, 2022

(86) PCT No.: PCT/CN2022/128740
§ 371 (c)(1),
(2) Date: Sep. 27, 2023

(87) PCT Pub. No.: WO2024/092439
PCT Pub. Date: May 10, 2024

(65) Prior Publication Data
US 2025/0098064 A1    Mar. 20, 2025

(51) Int. Cl.
*H05K 1/02* (2006.01)
*G02F 1/1335* (2006.01)
(Continued)

(52) U.S. Cl.
CPC ..... *H05K 1/0298* (2013.01); *G02F 1/133603* (2013.01); *G02F 1/133612* (2021.01);
(Continued)

(58) Field of Classification Search
CPC ...... H05K 1/0298; H05K 1/116; H05K 3/282; H05K 2201/10106; H05K 2201/2054; G02F 1/133612; G02F 1/133603
See application file for complete search history.

(56) References Cited

U.S. PATENT DOCUMENTS 6,519,845 B1    2/2003    Cutting et al.
6,620,720 B1    9/2003    Moyer et al.
(Continued)

FOREIGN PATENT DOCUMENTS

CN    202095173 U    12/2011
CN    202159705 U    3/2012
(Continued)

OTHER PUBLICATIONS

Cheng X, CN-114823608-A, Jul. 2022 (Year: 2022).*
(Continued)

*Primary Examiner* — Mary Ellen Bowman
(74) *Attorney, Agent, or Firm* — Dority & Manning, P.A.

(57) ABSTRACT

A circuit board includes a substrate, a first conductive layer, a first insulating layer and a second conductive layer. The first conductive layer includes a plurality of first conductive portions. The second conductive layer includes a plurality of second conductive portions. A second conductive portion passes through a first via hole in the first insulating layer to be in electrical contact with a first conductive portion. The first conductive layer and the second conductive layer each include at least one main conductive layer, which is capable of creating a first intermetallic compound with solder. At least one of the first conductive layer and the second
(Continued)

conductive layer further includes a stop layer capable of creating a second intermetallic compound with the solder. A rate of a reaction between the stop layer and the solder is lower than a rate of a reaction between the main conductive layer and the solder.

20 Claims, 9 Drawing Sheets

(51) Int. Cl.
*G02F 1/13357* (2006.01)
*H05K 1/11* (2006.01)
*H05K 3/28* (2006.01)

(52) U.S. Cl.
CPC ............ *H05K 1/116* (2013.01); *H05K 3/282* (2013.01); *H05K 2201/10106* (2013.01); *H05K 2201/2054* (2013.01)

(56) References Cited

U.S. PATENT DOCUMENTS

| | | | |
|---|---|---|---|
| 8,354,009 | B2 | 1/2013 | Han et al. |
| 2006/0222821 | A1 | 10/2006 | Masai |
| 2007/0122649 | A1 | 5/2007 | Lee et al. |
| 2007/0232051 | A1 | 10/2007 | Wang et al. |
| 2008/0081157 | A1 | 4/2008 | Schneegans et al. |
| 2008/0096015 | A1 | 4/2008 | Yan |
| 2008/0122086 | A1 | 5/2008 | Tsao et al. |
| 2008/0169539 | A1 | 7/2008 | Fang et al. |
| 2008/0264681 | A1 | 10/2008 | Iwai et al. |
| 2009/0297879 | A1 | 12/2009 | Zeng et al. |
| 2010/0213608 | A1 | 8/2010 | Lau et al. |
| 2010/0301484 | A1 | 12/2010 | Bchir et al. |
| 2011/0062580 | A1 | 3/2011 | Liu et al. |
| 2011/0186872 | A1 | 8/2011 | Kim |
| 2011/0220940 | A1 | 9/2011 | Kim |
| 2013/0000978 | A1* | 1/2013 | Choi ................ H01L 24/13 174/94 R |
| 2013/0107155 | A1 | 5/2013 | Guo et al. |
| 2013/0241058 | A1 | 9/2013 | Yu et al. |
| 2015/0099316 | A1 | 4/2015 | Ryu et al. |
| 2017/0250171 | A1 | 8/2017 | Yu et al. |
| 2017/0263645 | A1 | 9/2017 | Liu et al. |
| 2017/0358546 | A1 | 12/2017 | Shim et al. |
| 2019/0114957 | A1 | 4/2019 | Fan et al. |
| 2020/0035147 | A1 | 1/2020 | Ban et al. |
| 2020/0168461 | A1 | 5/2020 | Wang et al. |
| 2021/0143134 | A1 | 5/2021 | Wang |
| 2021/0223631 | A1 | 7/2021 | Ban et al. |
| 2021/0242146 | A1 | 8/2021 | Arvin et al. |
| 2021/0294158 | A1 | 9/2021 | Wang et al. |
| 2021/0358896 | A1* | 11/2021 | Lee ................ H01L 24/26 |
| 2021/0359182 | A1* | 11/2021 | Cao ................ H10H 20/857 |
| 2024/0234658 | A1* | 7/2024 | He ................ H05K 3/34 |
| 2024/0260185 | A1* | 8/2024 | Zhang ................ H05K 3/067 |

FOREIGN PATENT DOCUMENTS

| | | |
|---|---|---|
| CN | 102437135 A | 5/2012 |
| CN | 103904172 A | 7/2014 |
| CN | 104201121 A | 12/2014 |
| CN | 104244566 A | 12/2014 |
| CN | 104561943 A | 4/2015 |
| CN | 104810457 A | 7/2015 |
| CN | 105578709 A | 5/2016 |
| CN | 206471352 U | 9/2017 |
| CN | 107768343 A | 3/2018 |
| CN | 109449087 A | 3/2019 |
| CN | 110890323 A | 3/2020 |
| CN | 210837765 U | 6/2020 |
| CN | 111862886 A | 10/2020 |
| CN | 112186079 A | 1/2021 |
| CN | 112951791 A | 6/2021 |
| CN | 113066834 A | 7/2021 |
| CN | 113168046 A | 7/2021 |
| CN | 113629079 A | 11/2021 |
| CN | 113964112 A | 1/2022 |
| CN | 113966076 A | 1/2022 |
| CN | 114509884 A | 5/2022 |
| CN | 114823608 A | 7/2022 |
| CN | 114843390 A | 8/2022 |
| EP | 2276063 A2 | 1/2011 |
| JP | H08125310 A | 5/1996 |
| JP | 2005322703 A | 11/2005 |
| JP | 2009253275 A | 10/2009 |
| JP | 2011159870 A | 8/2011 |
| JP | 2014103143 A | 6/2014 |
| KR | 20130068112 A | 6/2013 |
| KR | 20210038512 A | 4/2021 |
| KR | 10-2021-0133777 A | 11/2021 |
| TW | 201345710 A | 11/2013 |
| TW | 201417649 A | 5/2014 |
| TW | 201520381 A | 6/2015 |
| WO | WO2008/092708 A1 | 8/2008 |
| WO | WO2009145461 A2 | 12/2009 |
| WO | WO2009145462 A2 | 12/2009 |
| WO | WO2020153770 A1 | 7/2020 |

OTHER PUBLICATIONS

He, CN-114509884-A, May 2022 (Year: 2022).*
Taiwanese First Office Action (w/ English translation) for corresponding TW Application No. 111141791, dated Aug. 2, 2023, 37 pages.
Taiwanese First Office Action (w/ English translation) for corresponding TW Application No. 112113817, dated Dec. 19, 2023, 27 pages.
PCT International Search Report and Written Opinion (w/ English translation) for corresponding PCT Application No. PCT/CN2021/142667, dated Aug. 12, 2022, 16 pages.
PCT International Search Report and Written Opinion (w/ English translation) for corresponding PCT Application No. PCT/CN2021/143613, dated Oct. 9, 2022, 16 pages.
PCT International Search Report and Written Opinion (w/ English translation) for corresponding PCT Application No. PCT/CN2022/077542, dated Oct. 10, 2022, 16 pages.
PCT International Search Report and Written Opinion (w/ English translation) for corresponding PCT Application No. PCT/CN2022/088130, dated Dec. 19, 2022, 18 pages.
Extended European Search Report for corresponding EP Application No. 21969681.2, dated Sep. 11, 2024, 11 pages.
Chinese Office Action (w/ English translation) for corresponding CN Application No. 202111239110.X, dated Nov. 22, 2024, 14 pages.
Extended European Search Report in corresponding EP Application No. 22937855.9, dated Feb. 19, 2025, in 7 pgs.
Extended European Search Report in corresponding EP Application No. 22955997.6, dated Mar. 12, 2025, in 8 pgs.
Chinese First Office Action (with English translation) for corresponding Application No. CN 202180004327.4, dated Sep. 18, 2025, 15 pages.
Jindu, "A brief summary of the surface coating (plating) layers of PCB soldering pads" (with English translation), Printed Circuit Information. No. 8, 2016, 10 pages.

* cited by examiner

CIRCUIT BOARD, LIGHT-EMITTING SUBSTRATE, BACKLIGHT MODULE, AND DISPLAY APPARATUS

CROSS-REFERENCE TO RELATED APPLICATION

This application is a national phase entry under 35 USC 371 of International Patent Application No. PCT/CN2022/128740, filed on Oct. 31, 2022, which is incorporated herein by reference in its entirety.

TECHNICAL FIELD

The present disclosure relates to the field of display technologies, and in particular, to a circuit board, a light-emitting substrate, a backlight module, and a display apparatus.

BACKGROUND

With the development of light-emitting diode technologies, backlight sources using light-emitting diodes (LEDs) with sub-millimeter scale (i.e., mini LEDs) and even micrometer scale (i.e., micro LEDs) have been widely used. Therefore, not only can a picture contrast of a product such as a liquid crystal display (LCD) using the backlight source reach a level of that of an organic light-emitting diode (OLED) display product, but also the product can retain the technical advantages of liquid crystal displaying. Thus, a display effect of the picture may be improved, and users are provided with a good visual experience.

SUMMARY

In an aspect, a circuit board is provided. The circuit board includes a substrate, a first conductive layer, a first insulating layer and a second conductive layer.

The first conductive layer is disposed on a side of the substrate. The first conductive layer includes a plurality of signal lines and a plurality of first conductive portions. The first insulating layer is disposed on a side of the first conductive layer away from the substrate. The first insulating layer is provided with first via holes extending through the first insulating layer. The second conductive layer is disposed on a side of the first insulating layer away from the substrate. The second conductive layer includes a plurality of second conductive portions. A second conductive portion passes through a first via hole to be in electrical contact with a first conductive portion, the second conductive portion includes a plurality of pads, and a pad is a portion of the second conductive portion exposed by the first via hole in the first insulating layer.

The first conductive layer and the second conductive layer each include at least one main conductive layer, and the main conductive layer is configured to be capable of creating a first intermetallic compound with solder. At least one of the first conductive layer and the second conductive layer further includes a stop layer, and the stop layer is disposed between two adjacent main conductive layers and is configured to be capable of creating a second intermetallic compound with the solder. A rate of a reaction between the stop layer and the solder is lower than a rate of a reaction between the main conductive layer and the solder.

In some embodiments, a material of the stop layer includes any of nickel, a copper alloy with a copper atomic percentage greater than 40% and a nickel alloy with a nickel atomic percentage greater than 40%.

In some embodiments, a thickness of the stop layer is in a range of 100 Å to 5000 Å, inclusive.

In some embodiments, the circuit board further includes an anti-oxidation layer. The anti-oxidation layer is disposed on a side of the second conductive layer away from the substrate, and the anti-oxidation layer is configured to be capable of creating a third intermetallic compound with the solder.

In some embodiments, the circuit board further includes traces, and the anti-oxidation layer encompasses both the traces and the second conductive portion in the second conductive layer.

In some embodiments, a material of the anti-oxidation layer includes nickel or a nickel alloy with a nickel atomic percentage greater than 40%.

In some embodiments, a thickness of the anti-oxidation layer is in a range of 100 Å to 40000 Å, inclusive.

In some embodiments, the first conductive layer further includes an adhesive layer, and the adhesive layer is disposed between a main conductive layer of the first conductive layer and the substrate, and the adhesive layer is not capable of reacting with the solder.

In some embodiments, a material of the adhesive layer includes any of titanium, molybdenum, a molybdenum-niobium alloy, a molybdenum-titanium alloy, a molybdenum-tungsten alloy, a molybdenum-tantalum alloy, and a molybdenum-niobium-titanium alloy.

In some embodiments, a thickness of the adhesive layer is in a range of 100 Å to 2000 Å, inclusive.

In some embodiments, an area of an orthogonal projection of the first conductive portion on the substrate is greater than an area of an orthogonal projection of the pad on the substrate, and the orthogonal projection of the pad on the substrate is located with the orthogonal projection of the first conductive portion on the substrate.

In some embodiments, the first conductive layer includes a single main conductive layer and a single stop layer, the second conductive layer includes another single main conductive layer and another single stop layer, and two stop layers are located between the single main conductive layer of the first conductive layer and the another single main conductive layer of the second conductive layer. Alternatively, the first conductive layer includes a single main conductive layer, the second conductive layer includes another single main conductive layer and a single stop layer, and the single stop layer is located between the single main conductive layer of the first conductive layer and the another single main conductive layer of the second conductive layer. Alternatively, the first conductive layer includes a single main conductive layer and a single stop layer, the second conductive layer includes another single main conductive layer, and the single stop layer is located between the single main conductive layer of the first conductive layer and the another single main conductive layer of the second conductive layer.

In some embodiments, the plurality of second conductive portions are divided into a plurality of device conductive portion groups and a plurality of chip conductive portion groups. The circuit board includes a plurality of driving units arranged in an array, and each driving unit includes multiple device conductive portion groups in the plurality of device conductive portion groups. The circuit board further includes a plurality of connecting lines. The multiple device conductive portion groups in a same driving unit are electrically connected by connection lines, and the plurality of connection lines are located in the first conductive layer and/or the second conductive layer.

In some embodiments, the plurality of second conductive portions are divided into a plurality of device conductive portion groups and a plurality of chip conductive portion groups. The signal lines include a first signal line and a second signal line. The first signal line is electrically connected to a device conductive portion group, and the second signal line is electrically connected to a chip conductive portion group. The first insulating layer is further provided with second via holes extending through the first insulating layer. The circuit board further includes a plurality of device transfer lines and a plurality of chip transfer lines.

The plurality of device transfer lines are located in the second conductive layer. An end of a device transfer line is in electrical contact with the first signal line through a second via hole, and another end thereof is in electrical contact with the device conductive portion group. The plurality of chip transfer lines are located in the second conductive layer. An end of a chip transfer line is in electrical contact with the second signal line through another second via hole, and another end thereof is in electrical contact with the chip conductive portion group.

In some embodiments, the circuit board further includes a first passivation layer and a second passivation layer. The first passivation layer is disposed between the first conductive layer and the first insulating layer and at least exposes part of the first conductive portion. The second passivation layer is disposed between the first insulating layer and the second conductive layer and at least exposes part of the first conductive portion. Multiple pads in the plurality of pads configured to be electrically connected to a same electronic component are exposed by a same first via hole, so that the first insulating layer does not exist in a region between the multiple pads.

In some embodiments, the circuit board further includes a third passivation layer and a second insulating layer. The third passivation layer is disposed on a side of the second conductive layer away from the substrate and at least exposes the pad. The second insulating layer is disposed on a side of the third passivation layer away from the substrate and at least exposes the pad. The third passivation layer and/or the second insulating layer further expose a region between multiple pads in the plurality of pads configured to be electrically connected to a same electronic component, so that the third passivation layer and/or the second insulating layer do not exist in the region between the multiple pads.

In another aspect, a light-emitting substrate is provided. The light-emitting substrate includes the circuit board as described in any of the above embodiments, and electronic components. Pins of an electronic component are electrically connected to pads in the circuit board by the solder.

In some embodiments, the circuit board includes an anti-oxidation layer, the second conductive layer further includes traces, and the anti-oxidation layer encompasses both the traces and the second conductive portions in the second conductive layer. The light-emitting substrate further includes a reflective layer. The reflective layer is disposed on a side of the anti-oxidation layer away from the substrate and is in contact with the anti-oxidation layer. The reflective layer is provided with a plurality of openings therein, and the pins of the electronic component are electrically connected to the solder and the pads through an opening.

In yet another aspect, a backlight module is provided. The backlight module includes the light-emitting substrate as described in any of the above embodiments, and a plurality of optical films. The light-emitting substrate has a light-emitting surface and a non-light-emitting surface that are opposite. The plurality of optical films are disposed on the light-emitting surface of the light-emitting substrate.

In yet another aspect, a display apparatus is provided. The display apparatus includes the backlight module as described above and a display panel. The display panel is disposed on a side of the plurality of optical films in the backlight module away from the light-emitting substrate.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments" "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. The term "connected" should be understood in a broad sense. For example, the term "connected" may represent a fixed connection, a detachable connection, or connected as an integral body; the term "connected" may be directly "connected" or indirectly "connected" by an intermediate medium. For example, the term "coupled" may indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B, and C" has the same meaning as the phrase "at least one of A, B, or C", and they both include the following combinations of A, B, and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that, when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

A compound composed of metal and metal or of metal and metalloid (such as H, B, N, S, P, C, Si) herein is referred to as an intermetallic compound (IMC). Elements in the intermetallic compound bond by metallic bond(s) to maintain metallic properties. The intermetallic compound is a product of an interfacial reaction.

As shown in FIG. 1, some embodiments of the present disclosure provide a display apparatus 1000. The display apparatus 1000 may be any apparatus that displays images whether in motion (such as a video) or fixed (such as a still image), and regardless of text or image.

For example, the display apparatus 1000 may be any product or component having a display function, such as a television, a notebook computer, a tablet computer, a mobile phone, a personal digital assistant (PDA), a navigator, a wearable device, an augmented reality (AR) device, and a virtual reality (VR) device.

In some embodiments, the display apparatus 1000 may be a liquid crystal display (LCD) apparatus.

Figure 2:
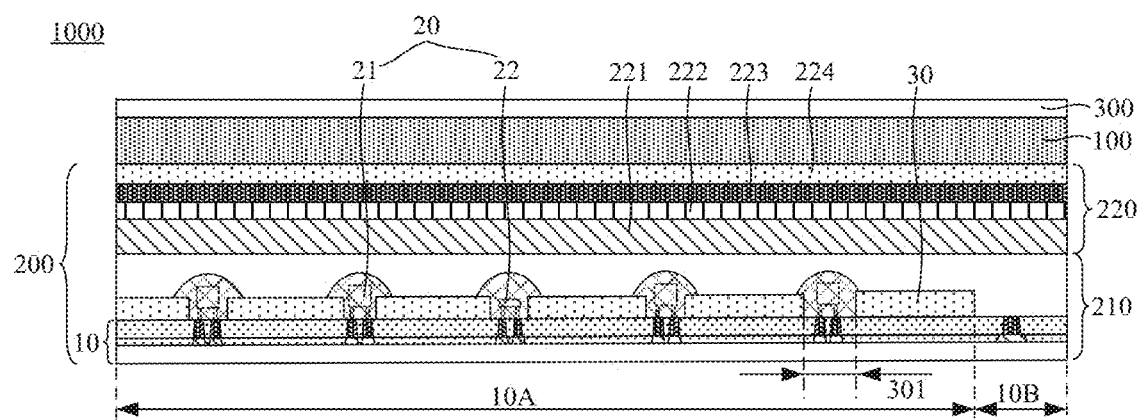
FIG. 2 is a sectional view of a display apparatus, in accordance with some embodiments.

As shown in FIG. 2, the display apparatus 1000 may include a display panel 100, a backlight module 200 and a glass cover 300.

The display panel 100 includes a light exit surface and a non-light exit surface. The light exit surface refers to a surface (an upper surface of the display panel 100 in FIG. 2) of the display panel 100 for displaying a picture, and the non-light exit surface refers to another surface (a lower surface of the display panel 100 in FIG. 2) opposite to the light exit surface.

The backlight module 200 is disposed on the non-light exit surface of the display panel 100, and the backlight module 200 is used for providing a light source for the display panel 100.

The glass cover 300 is disposed on the light exit surface of the display panel 100, and is used for protecting the display panel 100. For example, the material used for the glass cover 300 may be selected from rigid materials such as glass, quartz, plastic, or from flexible materials such as polymer resin.

In some example, with continued reference to FIG. 2, the backlight module 200 may include a light-emitting substrate 210 and a plurality of optical films 220.

The light-emitting substrate 210 has a light-emitting surface and a non-light-emitting surface that are opposite. The light-emitting surface refers to a surface (an upper surface of the light-emitting substrate 210 in FIG. 2) of the light-emitting substrate 210 for providing a light source, and the non-light-emitting surface refers to another surface (a lower surface of the light-emitting substrate 210 in FIG. 2) opposite to the light-emitting surface.

The plurality of optical films 220 are disposed on the light-emitting surface of the light-emitting substrate 210.

The light-emitting substrate 210 may emit white light directly, and the white light is incident onto the display panel 100 after being performed light uniformizing treatment by the plurality of optical films 220. Alternatively, the light-emitting substrate 210 may emit light of another color (e.g., blue light), and then the light is incident onto the display panel 100 after being performed color conversion and light uniformizing treatment by the plurality of optical films 220.

For example, as shown in FIG. 2, the plurality of optical films 220 includes a diffusion plate 221, a quantum dot film 222, a diffusion sheet 223 and a composite film 224 that are disposed in sequence in a direction away from the light-emitting substrate 210.

The diffusion plate 221 may blur the light emitted by the light-emitting substrate 210 and provide support for the quantum dot film 222, the diffusion sheet 223 and the composite film 224. The quantum dot film 222 may convert the light into white light under excitation of the light of a certain color emitted by the light-emitting substrate 210, so as to improve a utilization rate of light energy of the light-emitting substrate 210. The diffusion sheet 223 may uniformize the light passing through the diffusion sheet 223. The composite film 224 may improve light extraction efficiency of the backlight module 200 and improve the display brightness of the display apparatus 1000.

It will be noted that the composite film 224 may include a brightness enhancement film (BEF) and a reflective polarization enhancement film (e.g., dual brightness enhancement film, DBEF), and utilizes principles of total reflection, refraction, and polarization to increase light flux within a certain angle range, so as to improve the brightness of the display apparatus 1000.

For example, the light-emitting substrate 210 emits blue light towards a direction away from the light-emitting substrate 210. The quantum dot film 222 may include a red quantum dot material, a green quantum dot material, and a transparent material. When the blue light emitted by the light-emitting substrate 210 passes through the red quantum dot material, the blue light is converted into red light. When the blue light passes through the green quantum dot material, the blue light is converted into green light. The blue light may directly pass through the transparent material. Then, the blue light, the red light and the green light are mixed and superimposed in a certain proportion to appear as white light. The diffusion plate 221 and the diffusion sheet 223 may uniformize the white light, so as to improve the light shadow generated by the light-emitting substrate 210, thereby improving display image quality of the display apparatus 1000.

In some embodiments, referring to FIG. 2, the light-emitting substrate 210 includes a circuit board 10, electronic components 20 and a reflective layer 30.

As shown in FIG. 2, the circuit board 10 includes a functional region 10A and a peripheral region 10B. The functional region 10A is configured to provide the electronic components 20, and the peripheral region 10B is configured to be bonded to another circuit board.

As shown in FIG. 2, the reflective layer 30 is disposed on the circuit board 10. Moreover, a boundary of the reflective layer 30 may, for example, coincide with a boundary of the functional region 10A of the circuit board 10. That is, the peripheral region 10B of the circuit board 10 may not be provided with the reflective layer 30.

As shown in FIG. 2, the reflective layer 30 is provided with a plurality of openings 301 therein. The pins of the electronic component 20 may be electrically connected with solder and pads in the circuit board 10 through the opening 301, so that the electronic component 20 is fixed on the circuit board 10.

A reflectivity of the reflective layer 30 is greater than or equal to 90%. For example, the material of the reflective layer 30 may include white ink and/or silicon-based white glue. For example, the material of the reflective layer 30 may include resin (e.g., epoxy resin, or polytetrafluoroethylene resin), titanium dioxide ($TiO_2$) and an organic solvent (e.g., dipropylene glycol methyl ether).

As shown in FIG. 2, the electronic components 20 may include light-emitting devices 21 and/or microchips 22.

As shown in FIG. 2, the light-emitting device 21 may include a micro LED or a mini LED. A size (e.g., a length) of the micro LED is less than 50 micrometres, for example, in a range of 10 micrometres to 50 micrometres. A size (e.g., a length) of the mini LED is in a range of 50 micrometres to 150 micrometres, for example, in a range of 80 micrometres to 120 micrometres.

As shown in FIG. 2, the microchip 22 may include a sensor chip or a driving chip. The sensor chip may be, for example, a photosensitive sensor chip or a thermosensitive sensor chip. The driving chip is used for providing a driving signal to the light-emitting device 21. Hereinafter, the embodiments of the present disclosure will be exemplarily illustrated by taking an example of the microchip 22 including the driving chip.

In the related art, during repairing the light-emitting substrate, electronic components with faulty may be removed. When the electronic components are removed from the circuit board, it may be likely to damage surface structures of the pads, so that the pads of the circuit board cannot be soldered with the electronic components again. As a result, the product may have a low maintainability rate, and have a low yield rate.

Figure 6A:
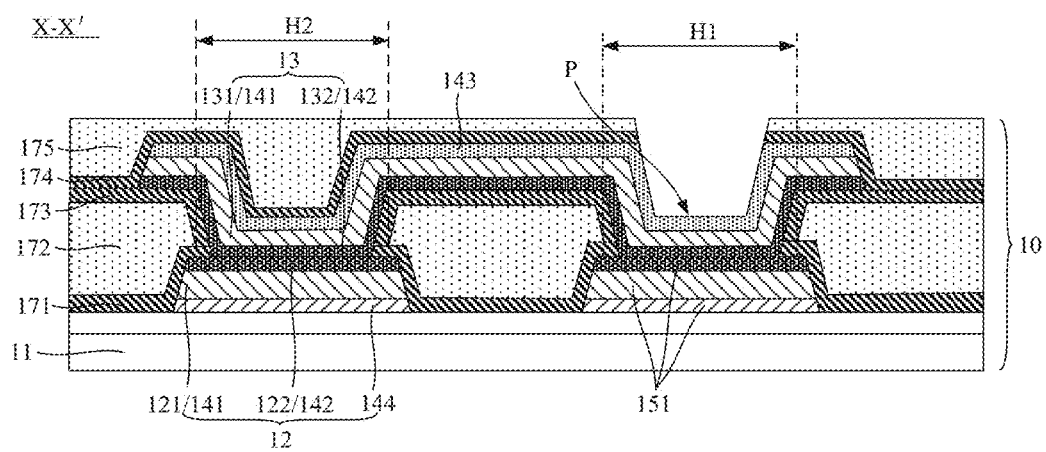
FIG. 6A is a sectional view taken along a section line X-X' in FIG. 4B.

In light of this, as shown in FIG. 6A, the circuit board 10 provided by some embodiments of the present disclosure includes a substrate 11, a first conductive layer 12, a first insulating layer 172 and a second conductive layer 13.

In some examples, a ratio of a thickness of the first conductive layer 12 to a thickness of the second conductive layer 13 in a direction perpendicular to a plane where the substrate 11 is located is in a range of 1:5 to 5:1. For example, the thickness of the first conductive layer 12 is the same as the thickness of the second conductive layer 13; alternatively, the thickness of the first conductive layer 12 is 0.2 times, 0.5 times, 0.7 times, 1.1 times, 1.2 times, 1.5 times, 2 times, 2.5 times, 3 times, 4.5 times, or 5 times of the thickness of the second conductive layer 13, which is not limited in the present disclosure.

In some examples, the substrate 11 may be a flexible substrate. For example, the flexible substrate may be a polyethylene terephthalate (PET) substrate, a polyethylene naphthalate (also referred to as polyethylene naphthalate two formic acid glycol ester, PEN) substrate, or a polyimide (PI) substrate.

In some examples, the substrate 11 may be a rigid substrate. For example, the rigid substrate may be a glass substrate or a polymethyl methacrylate (PMMA) substrate.

As shown in FIG. 6A, the first conductive layer 12 is disposed on a side of the substrate 11, the first insulating layer 172 is disposed on a side of the first conductive layer 12 away from the substrate 11, and the second conductive layer 13 is disposed on a side of the first insulating layer 172 away from the substrate 11.

Figure 5:
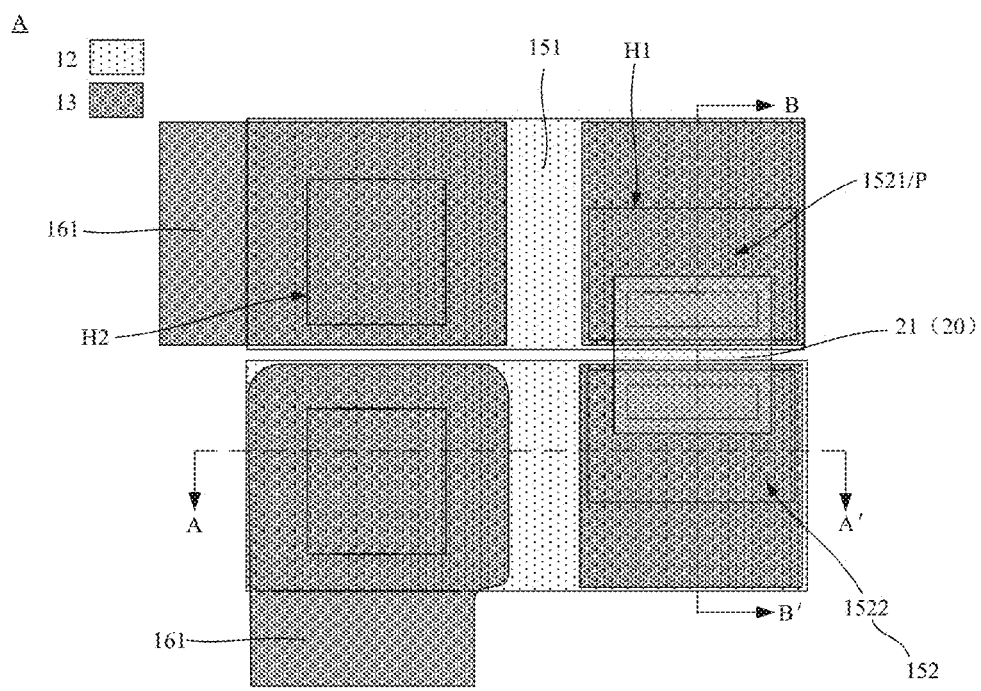
FIG. 5 is a partial enlarged view of a region A in FIG. 4B.

As shown in FIGS. 5 and 6A, the first insulating layer 172 is provided with first via holes H1 extending through the first insulating layer 172.

It will be noted that the material of the first insulating layer 172 includes resin, such as epoxy resin. A thickness of the first insulating layer 172 is in a range of 2 μm to 10 μm. For example, the thickness of the first insulating layer 172 is any of 2 μm, 3 μm, 4 μm, 5 μm, 7 μm, 8 μm, and 10 μm.

Figure 3:
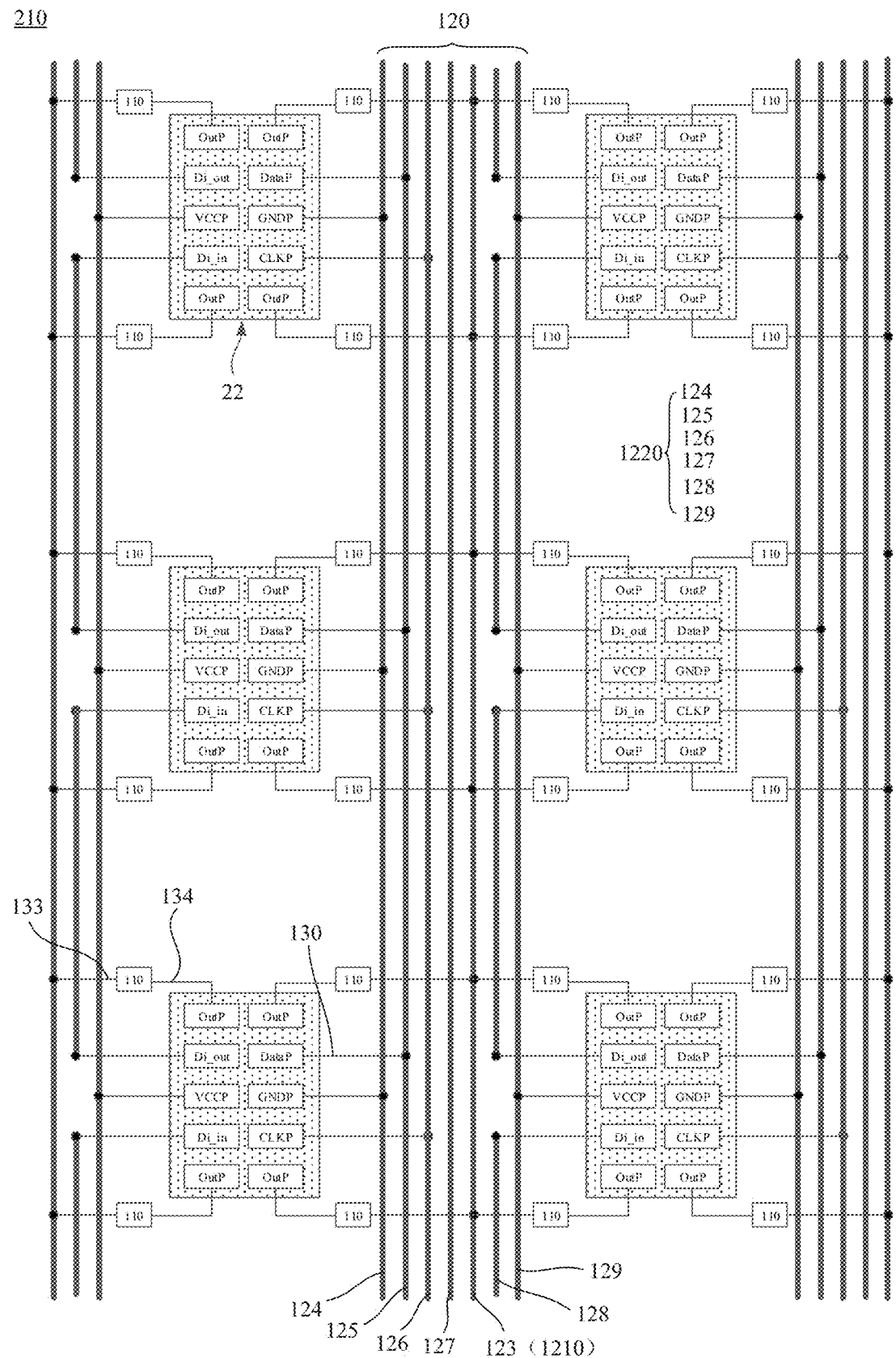
FIG. 3 is a circuit diagram of a light-emitting substrate, in accordance with some embodiments.
Figure 4A:
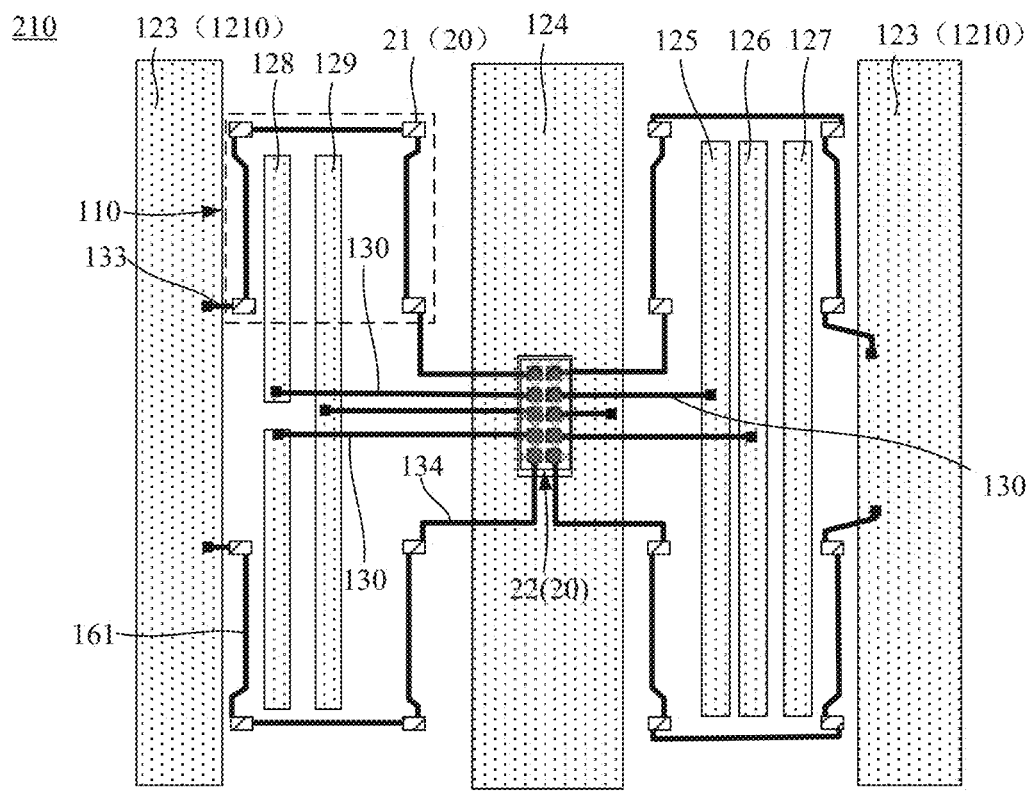
FIG. 4A is a top view of a light-emitting substrate in FIG. 3.

Referring to FIGS. 3, 4A and 5, the first conductive layer 12 includes a plurality of signal lines 120 and a plurality of first conductive portions 151, and the second conductive layer 13 includes a plurality of second conductive portions 152. The second conductive portion 152 is in electrical contact with the first conductive portion 151 through the first via hole H1. The second conductive portion 152 includes a pad P, and the pad P is a portion of the second conductive portion 152 exposed by the first via hole H1 in the first insulating layer 172. The above electronic component 20 is soldered onto the pad P by solder, so as to be fixed on the circuit board 10. Here, the solder may, for example, include tin.

It will be noted that an area of an orthographic projection of the first conductive portion 151 on the substrate 11 may be the same as an area of an orthographic projection of the pad P on the substrate 11, or may be different from the area of the orthographic projection of the pad P on the substrate 11. For example, the area of the orthographic projection of the first conductive portion 151 on the substrate 11 is larger than the area of the orthographic projection of the pad P on the substrate 11, and the orthographic projection of the pad P on the substrate 11 is located within the orthographic projection of the first conductive portion 151 on the substrate 11, which is beneficial for flatten an upper surface of the pad P.

It will be understood that the first conductive layer 12 may be formed by a plurality of deposition and photolithography processes, and the second conductive layer 13 may be formed by a plurality of deposition and photolithography processes. That is, the first conductive layer 12 and the second conductive layer 13 may each be a laminated structure formed by stacking a plurality of conductive materials layers.

For example, referring to FIG. 6A, the first conductive layer 12 and the second conductive layer 13 each include at least one main conductive layer 141, and the main conductive layer 141 and the solder may create a first intermetallic compound. For ease of distinction, a main conductive layer 141 in the first conductive layer 12 is referred to as a first main conductive layer 121, and a main conductive layer 141 in the second conductive layer 13 is referred to as a second main conductive layer 131 hereinafter.

Referring to FIG. 6A, a thickness of the first main conductive layer 121 is in a range of 0.6 μm to 4 μm. For example, the thickness of the first main conductive layer 121 is any of 0.6 μm, 0.9 μm, 1.8 μm, 2.7 μm, 3.6 μm and 4 μm.

Referring to FIG. 6A, a thickness of the second main conductive layer 131 may be in a range of 3000 Å to 1.8 μm. For example, the thickness of the second main conductive layer 131 is any of 3000 Å, 6000 Å, 9000 Å, 1.2 μm, 1.5 μm and 1.8 μm.

It will be noted that the material of the main conductive layer 141 includes metal. For example, the material of the main conductive layer 141 includes copper or silver.

In addition, at least one of the first conductive layer 12 and the second conductive layer 13 further includes a stop layer 142. The stop layer 142 is disposed between two adjacent main conductive layers 141. In this case, in a region where any pad P is located, there are at least two main conductive layers 141 and a stop layer 142 between two adjacent main conductive layers 141. For ease of distinction, a stop layer 142 in the first conductive layer 12 is called a first stop layer 122, and a stop layer 142 in the second conductive layer 13 is called a second stop layer 132 hereinafter.

Figure 9A:
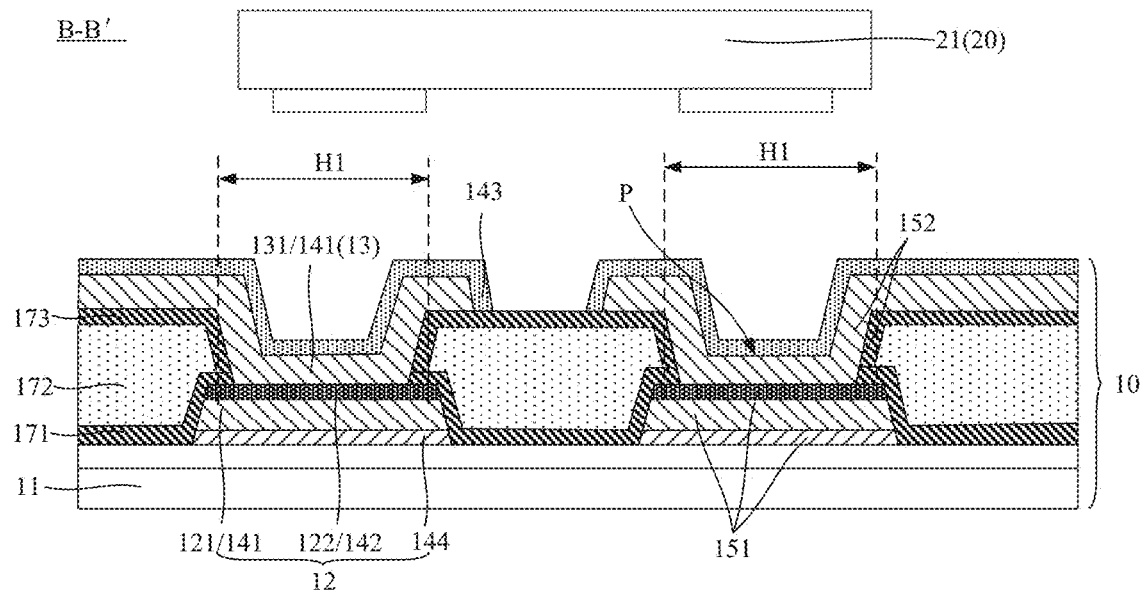
FIG. 9A is yet another sectional view taken along a section line B-B' in FIG. 5.

For example, as shown in FIGS. 5 and 9A, the first conductive layer 12 includes a first main conductive layer 121 and a first stop layer 122, and the second conductive layer 13 includes a second main conductive layer 131. The first stop layer 122 is located between the first main conductive layer 121 and the second main conductive layer 131.

In this case, the first conductive portion 151 includes the first main conductive layer 121 and the first stop layer 122, and the second conductive portion 152 includes the second main conductive layer 131. That is, in the region where the pad P is located, there are two main conductive layers 141 and one stop layer 142 between the two main conductive layers 141.

Figure 9B:
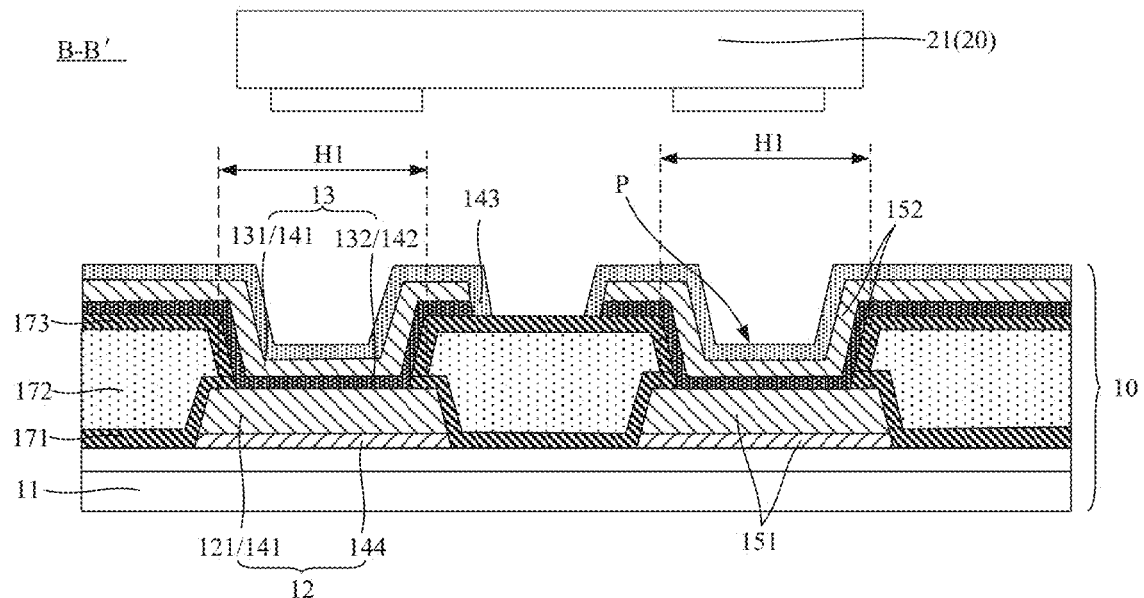
FIG. 9B is yet another sectional view taken along a section line B-B' in FIG. 5.

For another example, as shown in FIGS. 5 and 9B, the first conductive layer 12 includes a first main conductive layer 121, and the second conductive layer 13 includes a second main conductive layer 131 and a second stop layer 132. The second stop layer 132 is located between the first main conductive layer 121 and the second main conductive layer 131.

In this case, the first conductive portion 151 includes the first main conductive layer 121, and the second conductive portion 152 includes the second main conductive layer 131 and the second stop layer 132. That is, in the region where the pad P is located, there are two main conductive layers 141 and one stop layer 142 between the two main conductive layers 141.

Figure 8A:
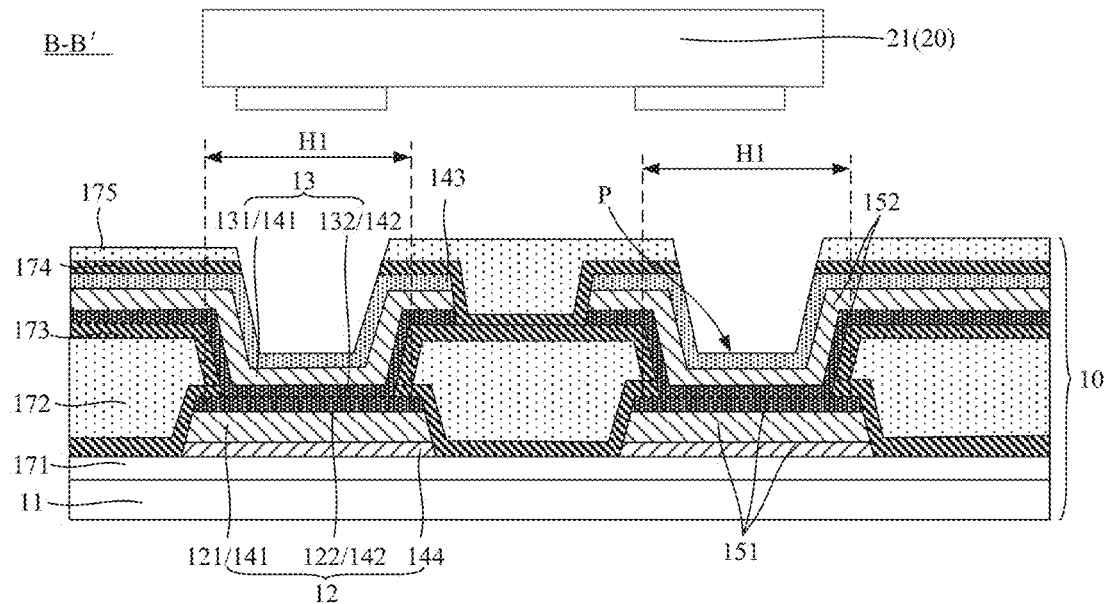
FIG. 8A is a sectional view taken along a section line B-B' in FIG. 5.

For another example, as shown in FIGS. 5 and 8A, the first conductive layer 12 includes a first main conductive layer 121 and a first stop layer 122, and the second conductive layer 13 includes a second main conductive layer 131 and a second stop layer 132. Both the first stop layer 122 and the second stop layer 132 are located between the first main conductive layer 121 and the second main conductive layer 131.

In this case, the first conductive portion 151 includes the first main conductive layer 121 and the first stop layer 122, and the second conductive portion 152 includes the second main conductive layer 131 and the second stop layer 132. That is, in the region where the pad P is located, there are two main conductive layers 141 and two stop layers 142 between the two main conductive layers 141.

It will be noted that, in addition to the above embodiments, the first conductive layer 12 and the second conductive layer 13 may also include a plurality of main conductive layers 141 and a plurality of stop layers 142, which may specifically be set according to actual situation. The embodiments of the present disclosure will not list one by one here.

The stop layer 142 and the solder may create a second intermetallic compound, and a rate of a reaction between the stop layer 142 and the solder is lower than a rate of a reaction between the main conductive layer 141 and the solder.

Here, the material of the stop layer 142 includes a metal simple substance or an alloy. The metal simple substance may include nickel. The alloy may include a copper alloy with a copper atomic percentage greater than 40% or a nickel alloy with a nickel atomic percentage greater than 40%. For example, the copper alloy may include a binary or ternary alloy of copper, such as any of a nickel-copper alloy, a nickel-copper-aluminum alloy, a copper-magnesium-aluminum alloy, and a copper-titanium alloy. For example, the nickel alloy may include a binary or ternary alloy of nickel, such as any of a nickel-aluminum alloy, a nickel-molybdenum alloy, a nickel-tungsten alloy, a nickel-titanium alloy, and a nickel-copper alloy.

In addition, in a case where the material of the stop layer 142 includes the nickel alloy with the nickel atomic percentage greater than 40%, the content of nickel atoms in the stop layer 142 may gradually decrease from the stop layer 142 toward the substrate 11, so that a rate of a reaction between a portion of the stop layer 142 proximate to the substrate 11 and the solder is smaller than a rate of a reaction between a portion of the stop layer 142 away from the substrate 11 and the solder.

It will be noted that, a thickness of the stop layer 142 may be in a range of 100 Å to 5000 Å. For example, the thickness of the stop layer 142 is any of 100 Å, 500 Å, 1000 Å, 2000 Å, 3000 Å, 4000 Å, and 5000 Å.

In this case, in a process of soldering the electronic component 20 and the pads P with solder, the solder is first heated to be melted, and then metal atoms therein create first intermetallic compounds with the metal atoms in the main conductive layer 141 while diffusing, and create fourth intermetallic compounds with the metal atoms in the pins of the electronic component 20, thereby realizing soldering. Here, by setting the thickness of the main conductive layer 141, the pins of the electronic component 20 and the pads P may be reliably connected.

It can be understood that, as the solder continues to diffuse, the metal atoms in the solder may further create second intermetallic compounds with metal atoms in the stop layer 142. Since the rate of the reaction between the stop layer 142 and the solder is relatively slow, the stop layer 142 may slow down the diffusion rate of the solder, and thus the diffusion position of the solder may be stopped at the stop layer 142 relatively easily.

In this way, during maintenance, when the electronic component 20 is removed, the pins of the electronic component 20 will at most remove the main conductive layer 141 and the stop layer 142 that react with it, and there is at least one main conductive layer 141 that has not reacted with the solder at a side of the stop layer 142 of the reaction proximate to the substrate 11. That is to say, after the electronic component 20 is removed, a region where the pad P of the electronic component 20 is removed may be soldered again, thereby improving the maintainability rate of the light-emitting substrate 210.

It will be noted that, in the first conductive portion 151 and the second conductive portion 152, each main conductive layer 141 may be soldered once. That is, a sum of the number of main conductive layer(s) 141 included in the first conductive portion 151 and the number of main conductive layer(s) 141 included in the second conductive portion 152 is equal to a total number of the electronic component 20 may be repeatedly soldered. That is, the number of the main conductive layers 141 included in the above first conductive layer 12 and second conductive layer 13 may be, for example, set according to the number of repairs required.

Figure 7A:
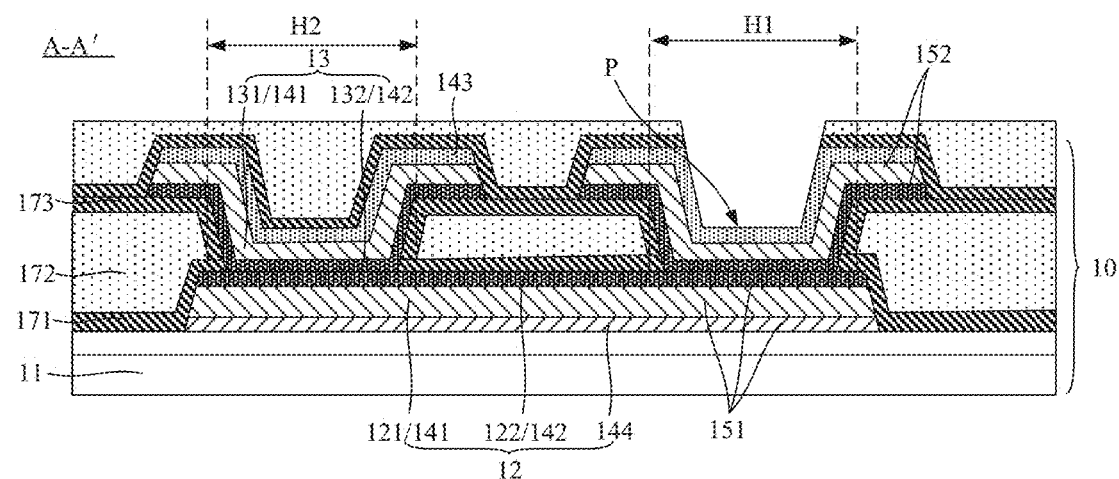
FIG. 7A is a sectional view taken along a section line A-A' in FIG. 5.

In some embodiments, as shown in FIGS. 5 and 7A, the circuit board 10 further includes an anti-oxidation layer 143. The anti-oxidation layer 143 is disposed on a side of the second conductive layer 13 away from the substrate 11, so as to avoid oxidation of exposed upper surfaces of both traces and the second conductive portions 152 in the second conductive layer 13. Moreover, the anti-oxidation layer 143 and the solder may create a third intermetallic compound, so that the solder may diffuse to the main conductive layer 141 for soldering.

In some examples, as shown in FIGS. 6A, 7A and 8A, the anti-oxidation layer 143 is located on surfaces of both the traces and the second conductive portions 152 in the second conductive layer 13 away from the substrate 11. That is, the anti-oxidation layer 143 covers the traces in the second conductive layer 13 and the exposed upper surface of the second conductive portion 152. In this way, the anti-oxidation layer 143 and the second conductive layer 13 may be formed by a single etching process using the same mask, and thus the process flow is simple.

It will be noted that, as for the traces in the second conductive layer 13, reference may be made to the following description, and the embodiments of the present disclosure will not provide details here.

Figure 6B:
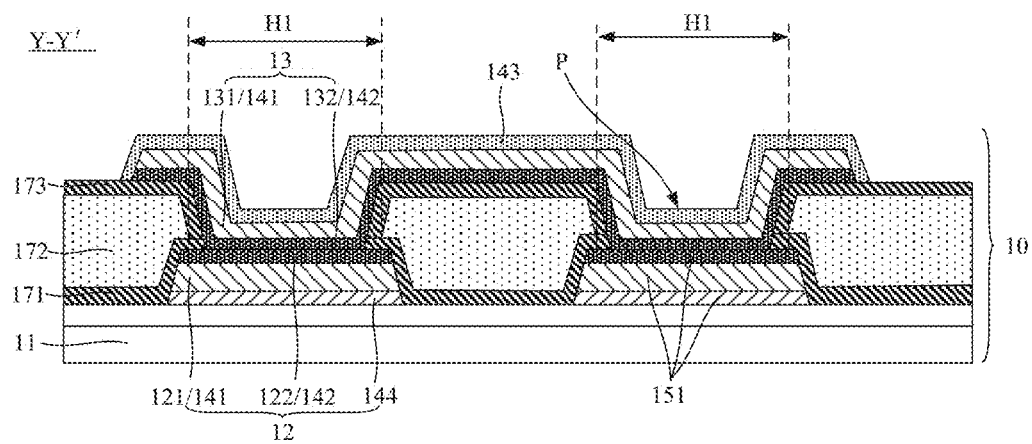
FIG. 6B is another sectional view taken along a section line Y-Y' in FIG. 4B.
Figure 7B:
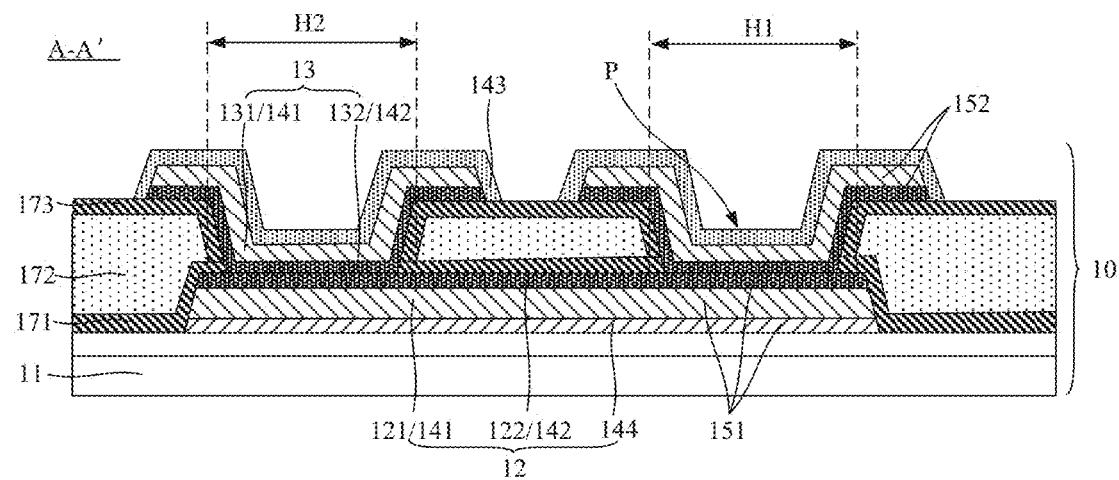
FIG. 7B is another sectional view taken along a section line A-A' in FIG. 5.
Figure 8B:
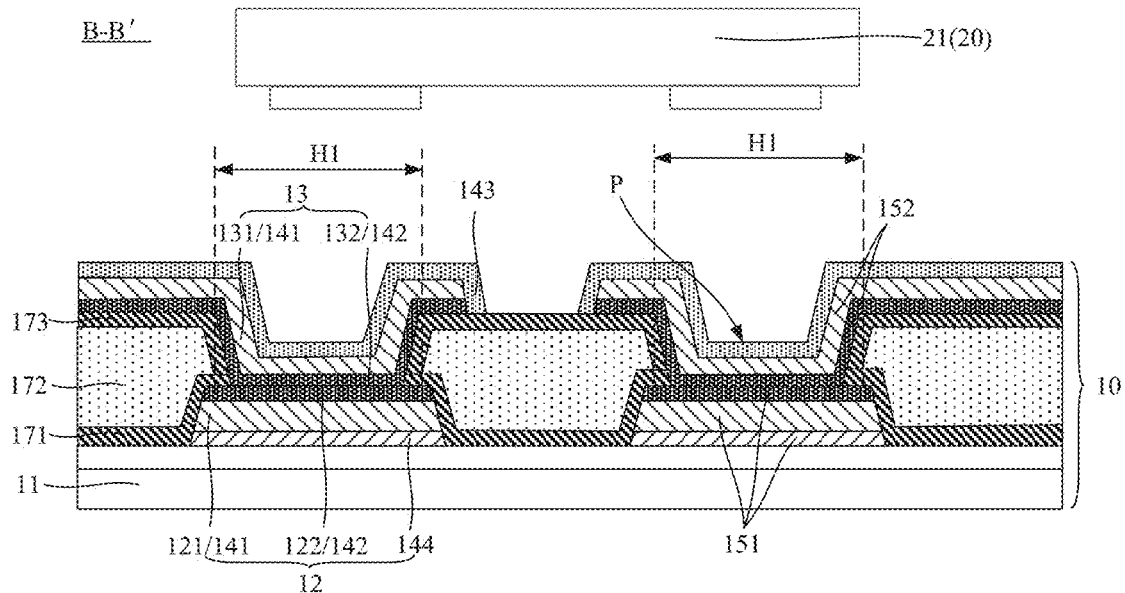
FIG. 8B is another sectional view taken along a section line B-B' in FIG. 5.

In some other examples, as shown in FIGS. 6B, 7B and 8B, the anti-oxidation layer 143 encompasses the traces and the second conductive portions 152 in the second conductive layer 13. That is, the anti-oxidation layer 143 covers exposed upper surfaces and side surfaces of the traces and pads P in the second conductive layer 13. In this case, the anti-oxidation layer 143 covers the exposed upper surfaces and side surfaces of the traces and the pads P, and completely encompasses the exposed surfaces of the traces and the pads P.

Figure 11:
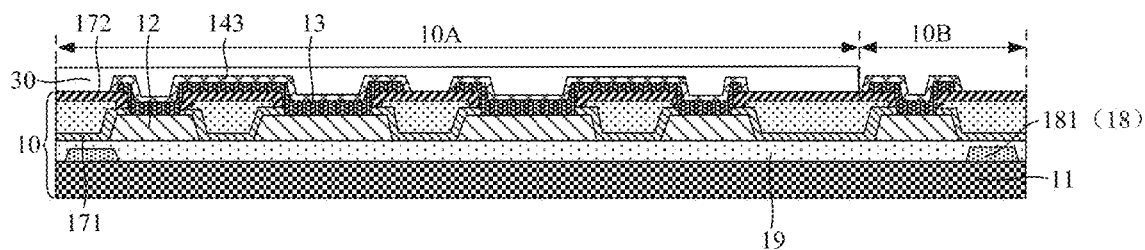
FIG. 11 is a sectional view of a circuit board covered with a reflective layer, in accordance with some embodiments.

Based on this, there is no need to provide other anti-oxidation insulating film layers, such as a passivation layer and resin, on the circuit board 10. That is to say, referring to FIGS. 2, 5 and 6B, in a case where the circuit board 10 includes the anti-oxidation layer 143, and the anti-oxidation layer 143 encompasses the traces and the second conductive portions 152 located in the second conductive layer 13, as shown in FIG. 11, the above reflective layer 30 may be disposed, for example, on a side of the anti-oxidation layer 143 away from the substrate 11, and in contact with the anti-oxidation layer 143.

With such a provision, the process flow may be simplified, and the cost of mass production may be reduced. Moreover, it may avoid an adverse effect on the reaction between the solder and the pad P due to a decrease in surface roughness of the pad P caused by the etching process during forming the passivation layer and resin, and avoid inability to form effective soldering due to bulge of the pad P caused by the stress of the passivation layer and the resin.

The material of the anti-oxidation layer 143 may be the same as or different from that of the stop layer 142. In a case where the material of the anti-oxidation layer 143 may be the same as that of the stop layer 142, the second intermetallic compound is the same as the third intermetallic compound.

For example, the material of the anti-oxidation layer 143 includes nickel or a nickel alloy with a nickel atomic percentage greater than 40%. For example, the material of the anti-oxidation conductive layer 143 includes a binary or ternary alloy of nickel, such as any of a nickel-aluminum alloy, a nickel-molybdenum alloy, a nickel-tungsten alloy, a nickel-titanium alloy, and a nickel-copper alloy.

It will be noted that, a thickness of the anti-oxidation layer 143 is in a range of 100 Å to 40000 Å. For example, the thickness of the anti-oxidation layer 143 is any of 100 Å, 500 Å, 5000 Å, 8000 Å, 10000 Å, 20000 Å, 30000 Å and 40000 Å.

In some embodiments, as shown in FIG. 6A, the first conductive layer 12 further includes an adhesive layer 144, and the adhesive layer 144 is disposed between the main conductive layer 141 of the first conductive layer 12 and the substrate 11, so as to improve adhesion between the main conductive layer 141 and the substrate 11.

The adhesive layer 144 cannot react with the solder, so as to prevent the solder from diffusing to the substrate 11 and causing damage to the substrate 11. For example, a material of the adhesive layer 144 includes a metal simple substance or a metal alloy. For example, the metal simple substance includes titanium or molybdenum. For example, the metal alloy includes any of a molybdenum-niobium alloy, a molybdenum-titanium alloy, a molybdenum-tungsten alloy, a molybdenum-tantalum alloy, and a molybdenum-niobium-titanium alloy.

It will be noted that, a thickness of the adhesive layer 144 is in a range of 100 Å to 2000 Å. For example, the thickness of the adhesive layer 144 is any of 100 Å, 300 Å, 500 Å, 1000 Å, 1200 Å, 1500 Å, and 2000 Å.

In some embodiments, referring to FIGS. 3 and 4A, the electronic components 20 include light-emitting devices 21 and microchips 22. The light-emitting substrate 210 includes a plurality of driving units 110 arranged in an array, and each driving unit 110 includes a plurality of light-emitting devices 21 connected in series and/or in parallel.

For example, as shown in FIG. 4A, each driving unit 110 includes four light-emitting devices 21 sequentially connected in series. Of course, each driving unit 110 may include four, five, seven or eight light-emitting devices 21, and a connection manner of the plurality of light-emitting devices 21 in the driving unit 110 is not limited to a series connection, but may also be a parallel connection. The embodiments of the present disclosure are not limited thereto.

Figure 4B:
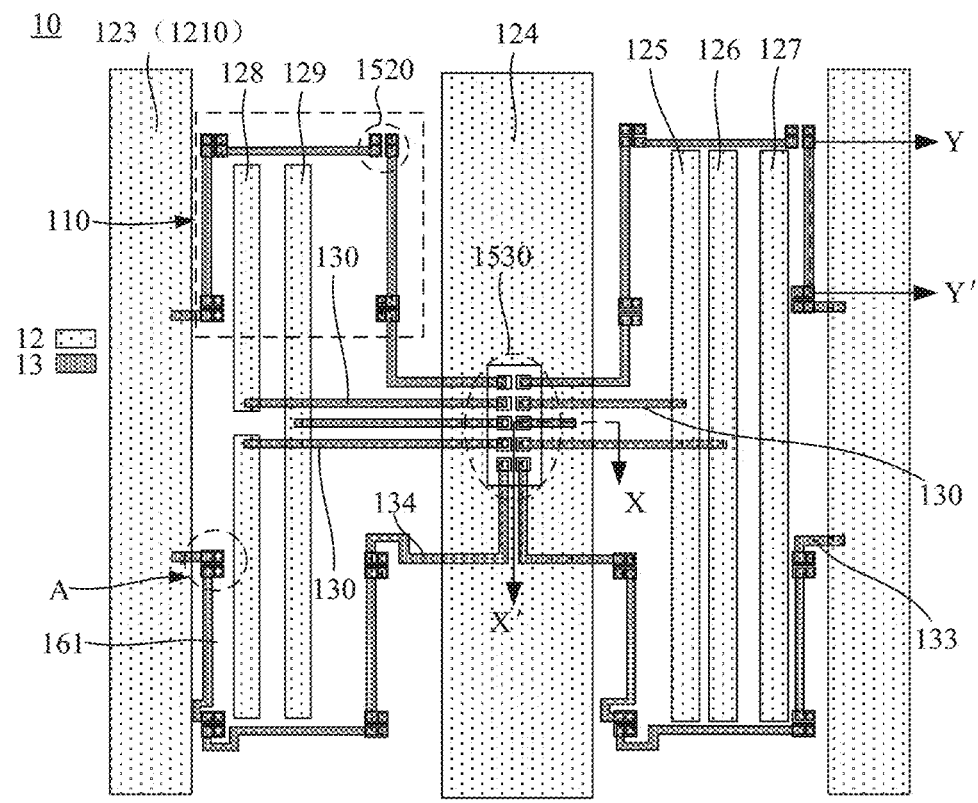
FIG. 4B is a structural diagram of a circuit board shown in FIG. 4A.

Based on the above, as shown in FIGS. 4A, 4B and 5, the plurality of second conductive portions 152 may be provided with a plurality of device conductive portion groups 1520. The device conductive portion group 1520 is configured to connect the light-emitting devices 21, that is, at least a portion of a surface of the device conductive portion group 1520 away from the substrate 11 is exposed to form a pad P, so as to achieve reliable electrical connection between the pins of the light-emitting device 21 and the solder.

As shown in FIGS. 4B and 5, the device conductive portion group 1520 includes an anode conductive portion 1521 and a cathode conductive portion 1522.

On this basis, referring to FIGS. 4A, 4B, 5 and 6B, the circuit board 10 further includes connection lines 161. The plurality of light-emitting devices 21 in the same driving unit 110 are electrically connected by connection lines 161, that is, device conductive portion groups 1520 in the same driving unit 110 are electrically connected by the connection lines 161.

For example, as shown in FIGS. 4B, 4C, 4D and 5, an end of a connection line 161 is electrically connected to a cathode conductive portion 1522 of a device conductive portion group 1520, and the other end thereof is electrically connected to an anode conductive portion 1521 of another device conductive portion group 1520.

The above connection lines 161 are located in the first conductive layer 12 and/or the second conductive layer 13.

Figure 4C:
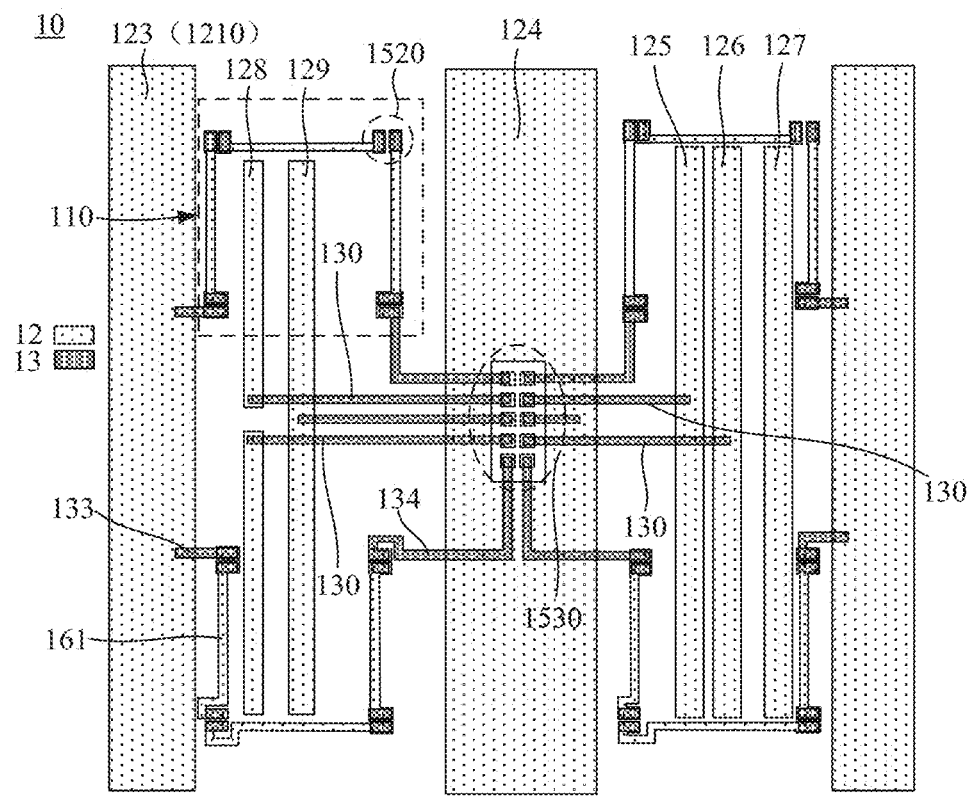
FIG. 4C is a structural diagram of another circuit board shown in FIG. 4A.
Figure 4D:
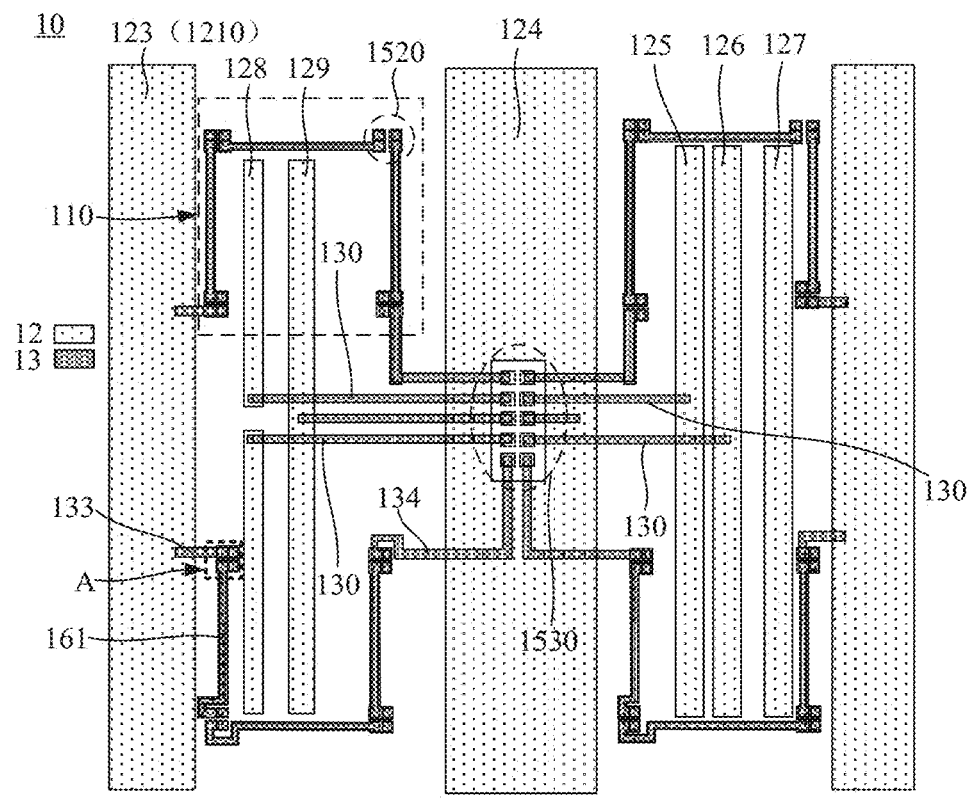
FIG. 4D is a structural diagram of yet another circuit board shown in FIG. 4A.

For example, as shown in FIG. 4C, the connection wire 161 is located in the first conductive layer 12. For another example, as shown in FIG. 4B, the connection line 161 is located in the second conductive layer 13. For another example, referring to FIG. 4D, the connection line 161 includes a first connection pattern and a second connection pattern that are overlapped, the first connection pattern is located in the first conductive layer 12, and the second connection pattern is located in the second conductive layer 13.

It will be noted that an area of the first connection pattern may be the same as or different from an area of the second connection pattern. For example, the area of the first connection pattern is larger than the area of the second connection pattern, and an orthographic projection of the second connection pattern on the substrate 11 is located within an orthographic projection of the first connection pattern on the substrate 11, which may facilitate the flatness of the upper surface of the connection line 161.

The above microchip 22 may be, for example, a driving chip for driving the plurality of light-emitting devices 21 to emit light. Here, a single microchip 22 may only drive the plurality of light-emitting devices 21 in a corresponding driving unit 110 to emit light, or a single microchip 22 may separately drive multiple light-emitting devices 21 in multiple driving units 110 to emit light.

For example, referring to FIGS. 3 and 4A, every four driving units 110 are electrically connected to a microchip 22, and the microchip 22 is electrically connected to multiple light-emitting devices 21 in the four driving units 110, so as to drive the multiple light-emitting devices 21 in the four driving units 110 to emit light.

Based on the above, as shown in FIGS. 4A and 4B, the plurality of second conductive portions 152 further include a plurality of chip conductive portion groups 1530. The chip conductive portion group 1530 is configured to connect the microchip 22. That is, at least a portion of a surface of the chip conductive portion group 1530 away from the substrate 11 is exposed to form a pad P, so as to achieve reliable electrical connection between the pins of the microchip 22 and the solder.

As shown in FIGS. 3, 4A and 4B, the chip conductive portion group 1530 includes a data conductive portion DataP, a clock conductive portion CLKP, an address conductive portion Di_in, a relay conductive portion Di_out, a chip power conductive portion VCCP, and a ground conductive portion GNDP and output conductive portions OutP.

The number of data conductive portions DataP may be one, the number of clock conductive portions CLKP may be one, the number of address conductive portions Di_in may be one, the number of relay conductive portions Di_out may be one, the number of chip power conductive portions VCCP may be one, the number of ground conductive portions GNDP may be one, and the number of output conductive portions OutP may be an even number, for example, the number of the output conductive portions OutP may be four.

On this basis, as shown in FIGS. 3, 4A and 4B, the plurality of signal lines 120 may, for example, further include first signal lines 1210 and second signal lines 1220. The first signal line 1210 is electrically connected to device conductive portion groups 1520, and the second signal line 1220 is electrically connected to the chip conductive portion group 1530.

On this basis, referring to FIGS. 4A, 5 and 6A, the first insulating layer 172 is further provided with second via holes H2 extending through the first insulating layer 172. The above circuit board 10 further includes a plurality of device transfer lines 133 and a plurality of chip transfer lines 130. The plurality of device transfer lines 133 are located in the second conductive layer 13, and the plurality of chip transfer lines 130 are located in the second conductive layer 13.

Referring to FIGS. 3, 4B, 5 and 6A, an end of a device transfer line 133 is in electrical contact with a first signal line 1210 through a second via hole H2, and the other end thereof is in electrical contact with a device conductive portion group 1520. An end of a chip transfer line 130 is in electrical contact with a second signal line 1220 through a second via hole H2, and the other end thereof is in electrical contact with a chip conductive portion group 1530. Therefore, it may avoid reducing an occupied area of circuit wiring and avoid short circuit at intersections of the circuit wiring.

For example, referring to FIG. 3, the first signal lines 1210 may include device power signal lines 123, and the second signal lines 1220 may include common voltage lines 124, data signal lines 125, clock signal lines 126, feedback signal lines 127, address signal lines 128 and chip power signal lines 129.

As shown in FIGS. 3, 4A and 5, the device power signal line 123 is electrically connected to an anode conductive portion 1521 of a first light-emitting device 21 in the driving unit 110 by a device transfer line 133. The common voltage line 124 is electrically connected to a ground conductive portion GNDP by a chip transfer line 130. The data signal line 125 is electrically connected to a data conductive portion DataP by a chip transfer line 130. The clock signal line 126 is electrically connected to a clock conductive portion CLKP by a chip transfer line 130. The feedback signal line 127 is electrically connected to a relay conductive portion Di_out by a chip transfer line 130. The address signal line 128 is electrically connected to an address conductive portion Di_in by a chip transfer line 130. The chip power signal line 129 is electrically connected to a chip power conductive portion VCCP by a chip transfer line 130.

In some embodiments, referring to FIGS. 4A, 4B and 6A, the circuit board 10 further includes connection transfer lines 134. The plurality of connection transition lines 134 are located in the second conductive layer 13. An end of a connection transfer line 134 is in electrical contact with a device conductive portion group 1520 through a second via hole H2, and the other end thereof is in electrical contact with a chip conductive portion group 1530 through a second via hole H2.

Figure 10A:
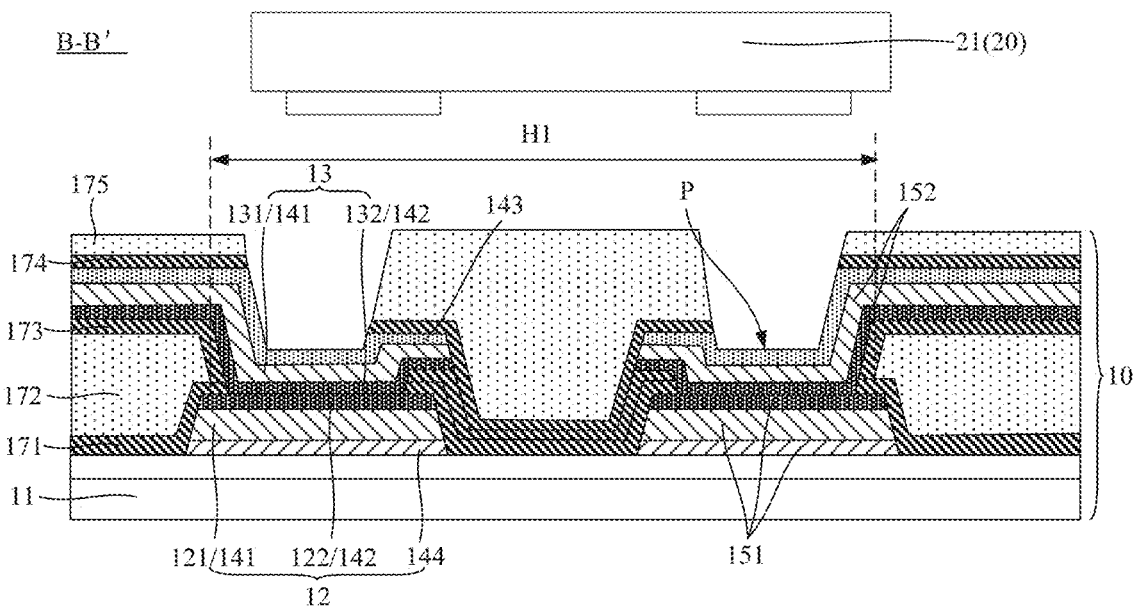
FIG. 10A is yet another sectional view taken along a section line B-B' in FIG. 5.

In some embodiments, as shown in FIG. 10A, the circuit board 10 further includes a first passivation layer 171 and a second passivation layer 173.

Here, materials of the first passivation layer 171 and the second passivation layer 173 may include at least one of inorganic insulating materials such as silicon nitride, silicon oxynitride and silicon oxide. For example, the materials of the first passivation layer 171 and the second passivation layer 173 each include silicon nitride (SiN). Thicknesses of the first passivation layer 171 and the second passivation layer 173 are each in a range of 1000 Å to 4000 Å, inclusive. For example, the thicknesses of the first passivation layer 171 and the second passivation layer 173 are each any of 1000 Å, 1500 Å, 2000 Å, 2500 Å, 3000 Å, 3500 Å, and 4000 Å.

As shown in FIG. 10A, the first passivation layer 171 is disposed between the first conductive layer 12 and the first insulating layer 172. The second passivation layer 173 is disposed between the first insulating layer 172 and the second conductive layer 13.

On this basis, as shown in FIG. 10A, multiple pads P electrically connected to the same electronic component 20 are exposed by the same first via hole H1, so that the first insulating layer 172 does not exist in a region between the multiple pads P electrically connected to the same electronic component 20.

In this case, the number of film layers between the multiple pads P electrically connected to the same electronic component 20 is reduced, thereby reducing a height difference of soldering surfaces of the multiple pads P electrically connected to the same electronic component 20, and improving flatness of the electronic component 20 after being fixed (e.g., improving flatness of a surface of the light-emitting device 21 on a light exit side, so that the exit light may be relatively uniform.

In some embodiments, as shown in FIG. 10A, the circuit board 10 further includes a third passivation layer 174 and a second insulating layer 175.

Here, a material of the third passivation layer 174 may include at least one of inorganic insulating materials such as silicon nitride, silicon oxynitride and silicon oxide. For example, the material of the third passivation layer 174 includes silicon nitride (SiN). A thickness of the third passivation layer 174 is in a range of 1000 Å to 6000 Å, inclusive. For example, the thickness of the third passivation layer 174 may be any of 1000 Å, 2000 Å, 3000 Å, 4000 Å, 5000 Å and 6000 Å.

In addition, a material of the second insulating layer 175 includes resin, for example, epoxy resin. A thickness of the second insulating layer 175 is in a range of 2 μm to 10 μm, inclusive. For example, the thickness of the second insulating layer 175 is any of 2 μm, 3 μm, 4 μm, 5 μm, 7 μm, 8 μm and 10 μm.

As shown in FIG. 10A, the third passivation layer 174 is disposed on a side of the second conductive layer 13 away from the substrate 11, and at least exposes the pad. The second insulating layer 175 is disposed on a side of the third passivation layer 174 away from the substrate 11, and at least exposes the pad P.

On this basis, the third passivation layer 174 and/or the second insulating layer 175 further exposes a region between the multiple pads P electrically connected to the same electronic component 20, so that the third passivation layer 174 and/or the second insulating layer 175 do not exist in the region between the multiple pads P electrically connected to the same electronic component 20.

Figure 10B:
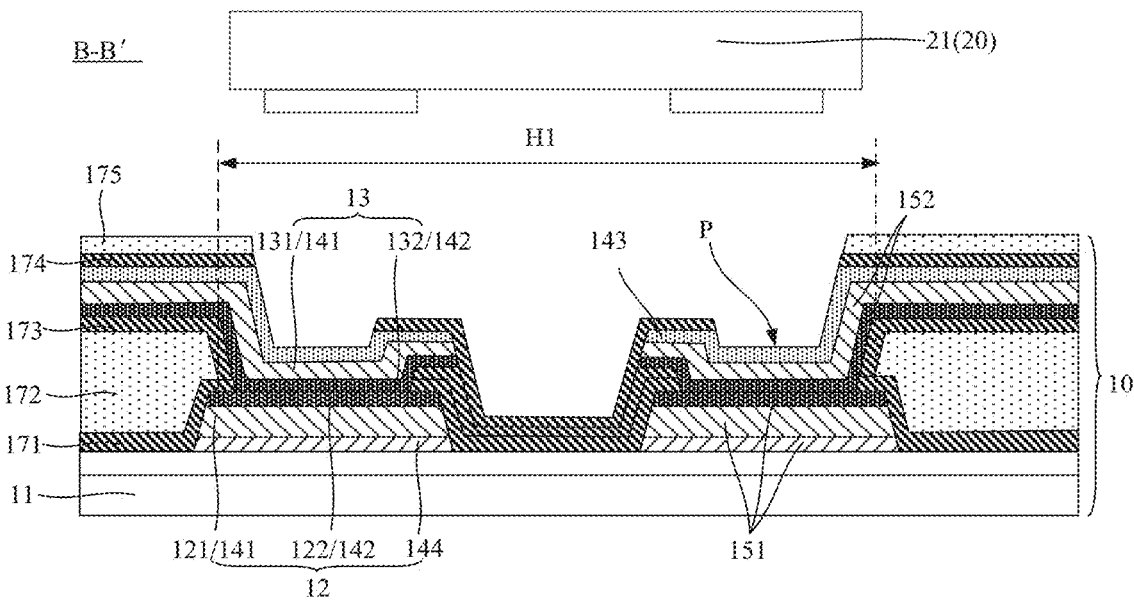
FIG. 10B is yet another sectional view taken along a section line B-B' in FIG. 5.

For example, as shown in FIG. 10B, the second insulating layer 175 further exposes the region between the multiple pads P electrically connected to the same electronic component 20, so that there is no second insulating layer 175 in the region between the multiple pads P electrically connected to the same electronic component 20.

In some embodiments, as shown in FIG. 11, the circuit board 10 further includes a marking layer 18 and a fourth passivation layer 19.

A material of the marking layer 18 includes metal. For example, the material of the marking layer 18 includes at least one of molybdenum, titanium, copper and niobium. A thickness of the marking layer 18 is in a range of 300 Å to 1000 Å, inclusive. For example, the thickness of the marking layer 18 is any of 300 Å, 400 Å, 500 Å, 600 Å, 800 Å and 1000 Å.

In addition, a material of the fourth passivation layer 19 may include at least one of inorganic insulating materials such as silicon nitride, silicon oxynitride and silicon oxide. For example, the material of the fourth passivation layer 19 includes silicon nitride (SiN). A thickness of the fourth passivation layer 19 is in a range of 1000 Å to 3000 Å, inclusive. For example, the thickness of the fourth passivation layer 19 is any of 1000 Å, 1500 Å, 2000 Å, 2500 Å and 3000 Å.

As shown in FIG. 11, the marking layer 18 is disposed between the substrate 11 and the first conductive layer 12, and the fourth passivation layer 19 is disposed between the marking layer 18 and the first conductive layer 12. The marking layer 18 includes at least one alignment mark 181, so as to facilitate alignment by collecting an image of the alignment mark 181 during the process.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A circuit board, comprising:
a substrate;
a first conductive layer disposed on a side of the substrate; the first conductive layer including a plurality of signal lines and a plurality of first conductive portions;
a first insulating layer disposed on a side of the first conductive layer away from the substrate; the first insulating layer being provided with first via holes extending through the first insulating layer; and
a second conductive layer disposed on a side of the first insulating layer away from the substrate; the second conductive layer including a plurality of second conductive portions; a second conductive portion passing through a first via hole to be in electrical contact with a first conductive portion; the second conductive portion including a plurality of pads, and a pad being a portion of the second conductive portion exposed by the first via hole in the first insulating layer; wherein the first conductive layer and the second conductive layer each include at least one main conductive layer, and the main conductive layer is configured to be capable of creating a first intermetallic compound with solder; at least one of the first conductive layer and the second conductive layer further includes a stop layer, and the stop layer is disposed between two adjacent main conductive layers and is configured to be capable of creating a second intermetallic compound with the solder; and a rate of a reaction between the stop layer and the solder is lower than a rate of a reaction between the main conductive layer and the solder.

2. The circuit board according to claim 1, wherein a material of the stop layer includes any of nickel, a copper alloy with a copper atomic percentage greater than 40% and a nickel alloy with a nickel atomic percentage greater than 40%.

3. The circuit board according to claim 1, wherein a thickness of the stop layer is in a range of 100 Å to 5000 Å, inclusive.

4. The circuit board according to claim 1, further comprising an anti-oxidation layer, wherein the anti-oxidation layer is disposed on a side of the second conductive layer away from the substrate, and the anti-oxidation layer is configured to be capable of creating a third intermetallic compound with the solder.

5. The circuit board according to claim 4, wherein the second conductive layer further includes traces, and the anti-oxidation layer encompasses both the traces and the second conductive portions in the second conductive layer.

6. The circuit board according to claim 4, wherein a material of the anti-oxidation layer includes nickel or a nickel alloy with a nickel atomic percentage greater than 40%.

7. The circuit board according to claim 4, wherein a thickness of the anti-oxidation layer is in a range of 100 Å to 40000 Å, inclusive.

8. The circuit board according to claim 1, wherein the first conductive layer further includes an adhesive layer, and the adhesive layer is disposed between a main conductive layer of the first conductive layer and the substrate, and the adhesive layer is not capable of reacting with the solder.

9. The circuit board according to claim 8, wherein a material of the adhesive layer includes any of titanium, molybdenum, a molybdenum-niobium alloy, a molybdenum-titanium alloy, a molybdenum-tungsten alloy, a molybdenum-tantalum alloy, and a molybdenum-niobium-titanium alloy.

10. The circuit board according to claim 8, wherein a thickness of the adhesive layer is in a range of 100 Å to 2000 Å, inclusive.

11. The circuit board according to claim 1, wherein an area of an orthogonal projection of the first conductive portion on the substrate is greater than an area of an orthogonal projection of the pad on the substrate, and the orthogonal projection of the pad on the substrate is located with the orthogonal projection of the first conductive portion on the substrate.

12. The circuit board according to claim 1, wherein the first conductive layer includes a single main conductive layer and a single stop layer, the second conductive layer includes another single main conductive layer and another single stop layer, and two stop layers are located between the single main conductive layer of the first conductive layer and the another single main conductive layer of the second conductive layer; or
the first conductive layer includes a single main conductive layer, the second conductive layer includes another single main conductive layer and a single stop layer, and the single stop layer is located between the single main conductive layer of the first conductive layer and the another single main conductive layer of the second conductive layer; or the first conductive layer includes a single main conductive layer and a single stop layer, the second conductive layer includes another single main conductive layer, and the single stop layer is located between the single main conductive layer of the first conductive layer and the another single main conductive layer of the second conductive layer.

13. The circuit board according to claim 1, wherein the plurality of second conductive portions are divided into a plurality of device conductive portion groups and a plurality of chip conductive portion groups;
the circuit board comprises a plurality of driving units arranged in an array, and each driving unit includes multiple device conductive portion groups in the plurality of device conductive portion groups; the circuit board further comprises:
a plurality of connection lines, wherein the multiple device conductive portion groups in a same driving unit are electrically connected by connection lines, and the plurality of connection lines are located in the first conductive layer and/or the second conductive layer.

14. The circuit board according to claim 1, wherein the plurality of second conductive portions are divided into a plurality of device conductive portion groups and a plurality of chip conductive portion groups;
the signal lines include a first signal line and a second signal line; the first signal line is electrically connected to a device conductive portion group, and the second signal line is electrically connected to a chip conductive portion group; and the first insulating layer is further provided with second via holes extending through the first insulating layer;
the circuit board further comprises:
a plurality of device transfer lines located in the second conductive layer, wherein an end of a device transfer line is in electrical contact with the first signal line through a second via hole, and another end thereof is in electrical contact with the device conductive portion group; and
a plurality of chip transfer lines located in the second conductive layer, wherein an end of a chip transfer line is in electrical contact with the second signal line through another second via hole, and another end thereof is in electrical contact with the chip conductive portion group.

15. The circuit board according to claim 1, further comprising:
a first passivation layer disposed between the first conductive layer and the first insulating layer and at least exposing part of the first conductive portion; and
a second passivation layer disposed between the first insulating layer and the second conductive layer and at least exposing part of the first conductive portion; wherein
multiple pads in the plurality of pads configured to be electrically connected to a same electronic component are exposed by a same first via hole, so that the first insulating layer does not exist in a region between the multiple pads.

16. The circuit board according to claim 1, further comprising:
a third passivation layer disposed on a side of the second conductive layer away from the substrate and at least exposing the pad; and
a second insulating layer disposed on a side of the third passivation layer away from the substrate and at least exposing the pad; wherein
the third passivation layer and/or the second insulating layer further expose a region between multiple pads in the plurality of pads configured to be electrically connected to a same electronic component, so that the third passivation layer and/or the second insulating layer do not exist in the region between the multiple pads.

17. A light-emitting substrate, comprising:
the circuit board according to claim 1; and
electronic components, pins of an electronic component being electrically connected to pads in the circuit board by the solder.

18. The light-emitting substrate according to claim 17, wherein the circuit board includes an anti-oxidation layer, the second conductive layer further includes traces, and the anti-oxidation layer encompasses both the traces and the second conductive portions in the second conductive layer; and
the light-emitting substrate further comprises a reflective layer; the reflective layer is disposed on a side of the anti-oxidation layer away from the substrate and is in contact with the anti-oxidation layer; the reflective layer is provided with a plurality of openings therein, and the pins of the electronic component are electrically connected to the solder and the pads through an opening.

19. A backlight module, comprising:
the light-emitting substrate according to claim 17, the light-emitting substrate having a light-emitting surface and a non-light-emitting surface that are opposite; and
a plurality of optical films disposed on the light-emitting surface of the light-emitting substrate.

20. A display apparatus, comprising:
the backlight module according to claim 19; and
a display panel disposed on a side of the plurality of optical films in the backlight module away from the light-emitting substrate.

* * * * *